US012710157B2

(12) United States Patent
Yoshida

(10) Patent No.: US 12,710,157 B2
(45) Date of Patent: Aug. 18, 2026

(54) LIGHT EMITTING MODULE AND MOBILE DEVICE

(71) Applicant: NICHIA CORPORATION, Anan (JP)

(72) Inventor: Norimasa Yoshida, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 19/182,751

(22) Filed: Apr. 18, 2025

(65) Prior Publication Data

US 2025/0334250 A1 Oct. 30, 2025

(30) Foreign Application Priority Data

Apr. 25, 2024 (JP) ................................ 2024-071814

(51) Int. Cl.

| | |
|---|---|
| ***F21V 5/04*** | (2006.01) |
| ***F21V 5/00*** | (2018.01) |
| ***G03B 15/05*** | (2021.01) |
| ***H10H 20/83*** | (2025.01) |
| ***H10H 20/851*** | (2025.01) |
| *G06F 1/16* | (2006.01) |

(52) U.S. Cl.

CPC .............. *F21V 5/048* (2013.01); *F21V 5/008* (2013.01); *G03B 15/05* (2013.01); *H10H 20/83* (2025.01); *H10H 20/851* (2025.01); *G06F 1/1686* (2013.01)

(58) Field of Classification Search

CPC ....... F21V 5/048; F21V 5/008; H10H 20/851; H10H 20/83; G03B 15/05; G06F 1/1686

See application file for complete search history.

(56) References Cited

U.S. PATENT DOCUMENTS

| | | | |
|---|---|---|---|
| 2005/0253923 A1 | 11/2005 | Komori et al. | |
| 2010/0321940 A1* | 12/2010 | Zhong | F21V 14/04 362/268 |
| 2018/0176349 A1* | 6/2018 | Aberle | G02B 13/001 |
| 2022/0146074 A1* | 5/2022 | Kiba | G02B 7/02 |
| 2024/0240774 A1 | 7/2024 | Takeuchi | |
| 2024/0288148 A1 | 8/2024 | Takeuchi | |
| 2024/0328600 A1 | 10/2024 | Yoshida et al. | |
| 2025/0035287 A1 | 1/2025 | Yoshida et al. | |

FOREIGN PATENT DOCUMENTS

| | | |
|---|---|---|
| JP | H07-064486 A | 3/1995 |
| JP | 2004-022257 A | 1/2004 |
| JP | 2004-119045 A | 4/2004 |
| JP | 2004-252469 A | 9/2004 |
| JP | 2006-310549 A | 11/2006 |
| JP | 2022-076443 A | 5/2022 |
| JP | 2023-007418 A | 1/2023 |
| WO | WO-2023/276256 A1 | 1/2023 |
| WO | WO-2023/112593 A1 | 6/2023 |
| WO | WO-2023/145248 A1 | 8/2023 |
| WO | WO-2024/038804 A1 | 2/2024 |
| WO | WO-2024/053465 A1 | 3/2024 |

* cited by examiner

*Primary Examiner* — Bao Q Truong

(74) *Attorney, Agent, or Firm* — Foley & Lardner LLP

(57) ABSTRACT

A light emitting module includes: a light source; a first lens disposed above the light source; and a second lens disposed above the first lens. The first lens includes: a lower face including a first convex face projecting towards the light source, and an upper face including a second convex face projecting towards the second lens. In a top view, an area of the second convex face is smaller than an area of the first convex face. At least one of an upper face or a lower of the second lens includes a concave face.

19 Claims, 7 Drawing Sheets

LIGHT EMITTING MODULE AND MOBILE DEVICE

CROSS-REFERENCE TO RELATED APPLICATION

This application claims priority to Japanese Patent Application No. 2024-071814, filed on Apr. 25, 2024, the disclosure of which is hereby incorporated by reference in its entirety.

TECHNICAL FIELD

The present disclosure relates to a light emitting module and a mobile device.

BACKGROUND

Japanese Patent Publication No. 2004-022257 discloses an LED lighting device that includes a light emitting module in which multiple LED elements are arranged on a substrate, a device casing that houses the light emitting module, a lens composed of a convex lens and a concave lens for controlling light distribution, and an optical filter for adjusting hue.

SUMMARY

One object of the present disclosure is to provide a light emitting module and a mobile device that can reduce the external visibility of a light source.

A light emitting module according to one embodiment of the present disclosure includes a light source, a first lens disposed above the light source, and a second lens disposed above the first lens. The first lens has a lower face that includes a first convex face projecting towards the light source, and an upper face that includes a second convex face projecting towards the second lens. In a top view, the second convex face is smaller in area than the first convex face. At least one of the upper face or the lower face of the second lens includes a concave face.

A mobile device according to one embodiment of the present disclosure includes a display part and a light emitting module disposed on the display part side in a top view. The light emitting module includes a light source, a first lens disposed above the light source, and a second lens disposed above the first lens. The first lens has a lower face that includes a first convex face projecting towards the light source, and an upper face that includes a second convex face projecting towards the second lens. In a top view, the second convex face is smaller in area than the first convex face. At least one of the upper face or the lower face of the second lens includes a concave face.

According to an embodiment of the present disclosure, the external visibility of a light source can be reduced.

DETAILED DESCRIPTION

Figure 1:
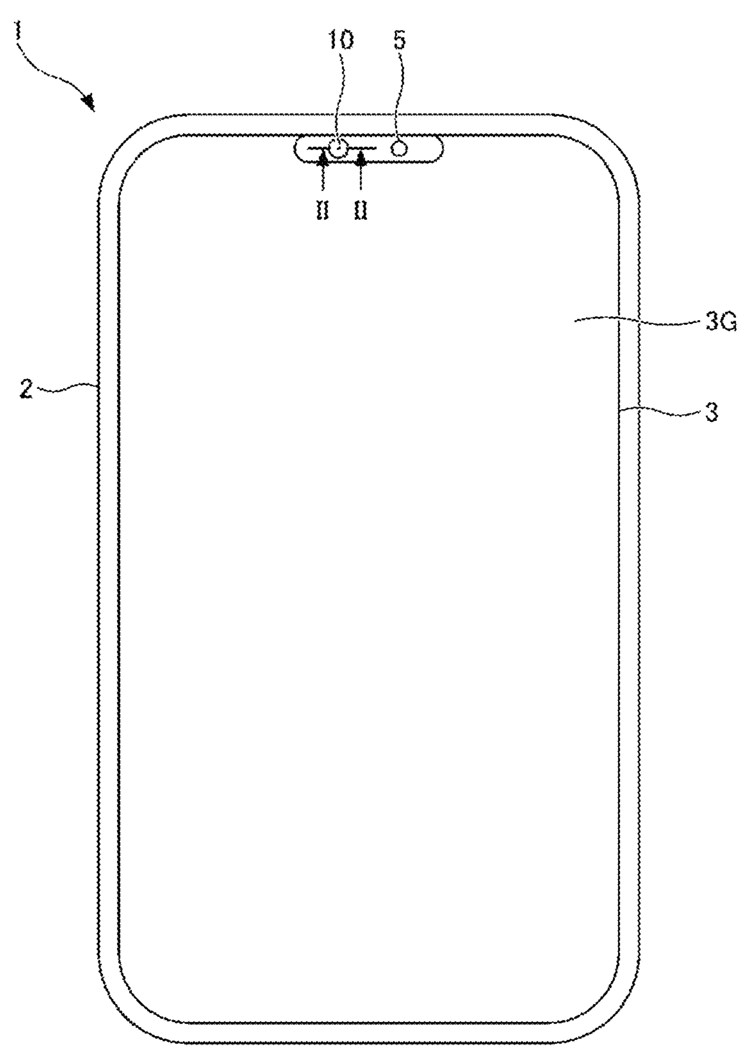
FIG. 1 is a top view schematically showing a mobile device according to an embodiment.
Figure 1:
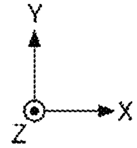

Light emitting modules and mobile devices according to certain embodiments of the present disclosure will be described in detail below with reference to the accompanying drawings. The embodiments described below are examples of light emitting modules and mobile devices provided to give shape to the technical ideas of the present disclosure, and the invention is not limited to those described below. The dimensions, materials, shapes, and relative positions of the constituents of the embodiments are merely provided as explanatory examples, and not intended to limit the scope of the present disclosure to those described below unless otherwise specifically noted. The sizes of and positional relationships between the members shown in each drawing may be exaggerated for clarity of explanation. In the description below, the same designations or reference numerals basically show the same or similar members, for which detailed explanation will be omitted as appropriate. An end face view that only shows a cut section might occasionally be used as a cross-sectional view.

In the drawings discussed below, directions are indicated by X-axis, Y-axis, and Z-axis. The X-axis, Y-axis, and Z-axis are directions that are orthogonal to one another. The X-axis direction indicated by the arrow represents the +X direction or the +X side, and the opposite direction to the +X direction represents the −X direction or the −X side. The Y-axis direction indicated by the arrow represents the +Y direction or the +Y side, and the opposite direction to the +Y direction represents the −Y direction or the −Y side. The Z-axis direction indicated by the arrow represents the +Z direction or the +Z side, and the opposite direction to the +Z direction represents the −Z direction or the −Z side. Furthermore, the term, in a top view, in the description of an embodiment refers to viewing a subject from the +Z direction or +Z side. These directions do not restrict the orientation of a light emitting module or a mobile device in use, and the orientation of the light emitting module or mobile device is optional. In the embodiments, the face of a subject viewed from the +Z direction or +Z side is referred to as the “upper face,” and the face of the subject viewed from the −Z direction or +Z side is referred to as the “lower face.” In the embodiments described below, a subject being along the X-axis, Y-axis, or Z axis includes the case in which the subject forms an oblique angle with any of these axes within a range of ±10°. Being orthogonal in the embodiments encompasses a tolerance of ±10° relative to 90°.

In the present disclosure, polygons such as quadrangles include a shape subjected to processing, such as cutting angles, chamfering, beveling, rounding, or the like. Moreover, the location of such processing is not limited to a corner (an end of a side) of a polygon. Rather, a shape subjected to processing in the intermediate portion of a side will similarly be referred to as a polygon. In other words, any polygon-based shape subjected to partially processing should be understood to be included in the interpretation of a "polygon."

This similarly applies to words expressing specific shapes besides polygons, such as a trapezoid, circle, projection, recess, or the like. This further applies to words related to sides that make up a shape. In other words, even when the end or intermediate portion of a side is subjected to processing, the interpretation of a "side" includes the processed section.

In the embodiments, "covering" includes not only a member directly covering an object, but also a member indirectly covering an object via another member. Moreover, "disposing" is not limited to a subject being disposed in direct contact with another, and includes disposing a subject on something via another member, for example.

Embodiments

Mobile Device

One example of the whole structure of a mobile device 1 according to an embodiment will be explained with reference to FIG. 1. FIG. 1 is a top view schematically showing the mobile device 1 according to the embodiment. For example, a mobile device 1 is a smartphone or tablet. However, the mobile device 1 is not limited to a smartphone or tablet.

As shown in FIG. 1, the mobile device 1 includes a casing 2, a display part 3, and a light emitting module 10. The mobile device 1 may include other constituents such as a camera 5. The camera 5 includes an imaging element for receiving reflected light from a photographic subject and converting the received optical signal into an electrical signal. The camera 5 can capture a still image and/or video using the electrical signals from the imaging element. In the example shown in FIG. 1, the camera 5 is disposed on the display part 3 side.

The display part 3 is disposed on the upper face side of the mobile device 1. The display part 3 includes a display screen, such as a liquid crystal display, organic EL (electroluminescence) display, or the like. The light emitting module 10 is disposed on the display part 3 side in the upper face of the mobile device 1. As shown in FIG. 1, the light emitting module 10 is located inward of the outer edge of the display part 3 in a top view. The light emitting module 10 may be disposed outward of the edge of the display part 3, such as in the region adjacent to the edge of the display part 3 in a top view.

The display part 3 includes a light transmissive cover plate 3G for protecting the members disposed in the casing 2, such as a backlight, deflector, and the like. In the example shown in FIG. 1, the light emitting module 10 is disposed at a position that overlaps the cover plate 3G. In other words, the cover plate 3G covers the light emitting module 10. However, the light emitting module 10 may be exposed from the cover plate 3G. For example, the cover plate 3G can have an opening, and the light emitting module 10 is disposed at a position that overlaps the opening.

As shown in FIG. 1, the light emitting module 10 is preferably disposed at a position that is aligned with the camera 5, for example. The light emitting module 10 can be used as a flash module for illuminating a subject when taking a photograph with the camera 5. The light emitting module 10 may be used for purposes other than a flash module for the mobile device 1. For example, the light emitting module 10 may be used as a torchlight (flashlight) for use at night or in a dark place.

Light Emitting Module 10

Figure 2:
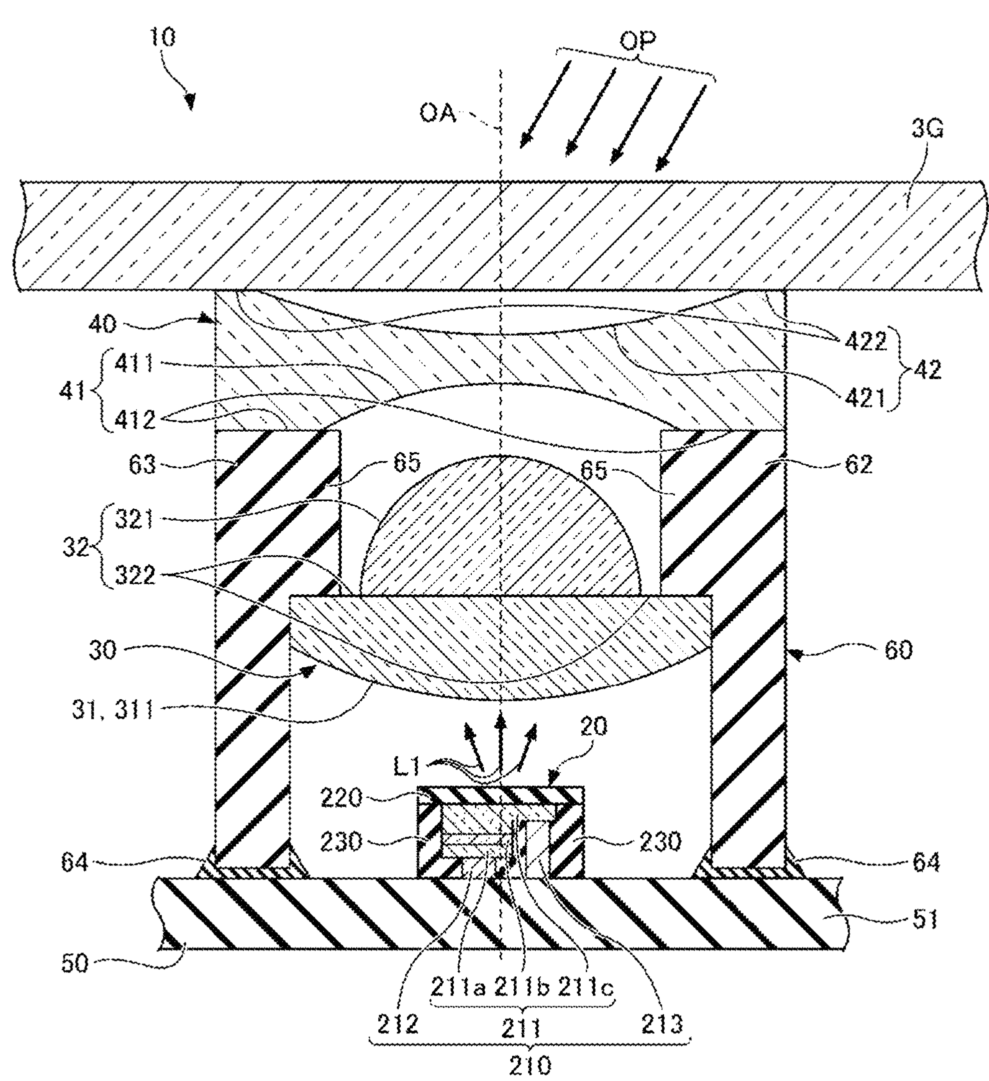
FIG. 2 is a cross-sectional view schematically showing a light emitting module according to an embodiment taken along line II-II in FIG. 1.
Figure 2:
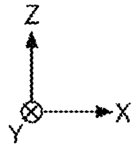
Figure 3:
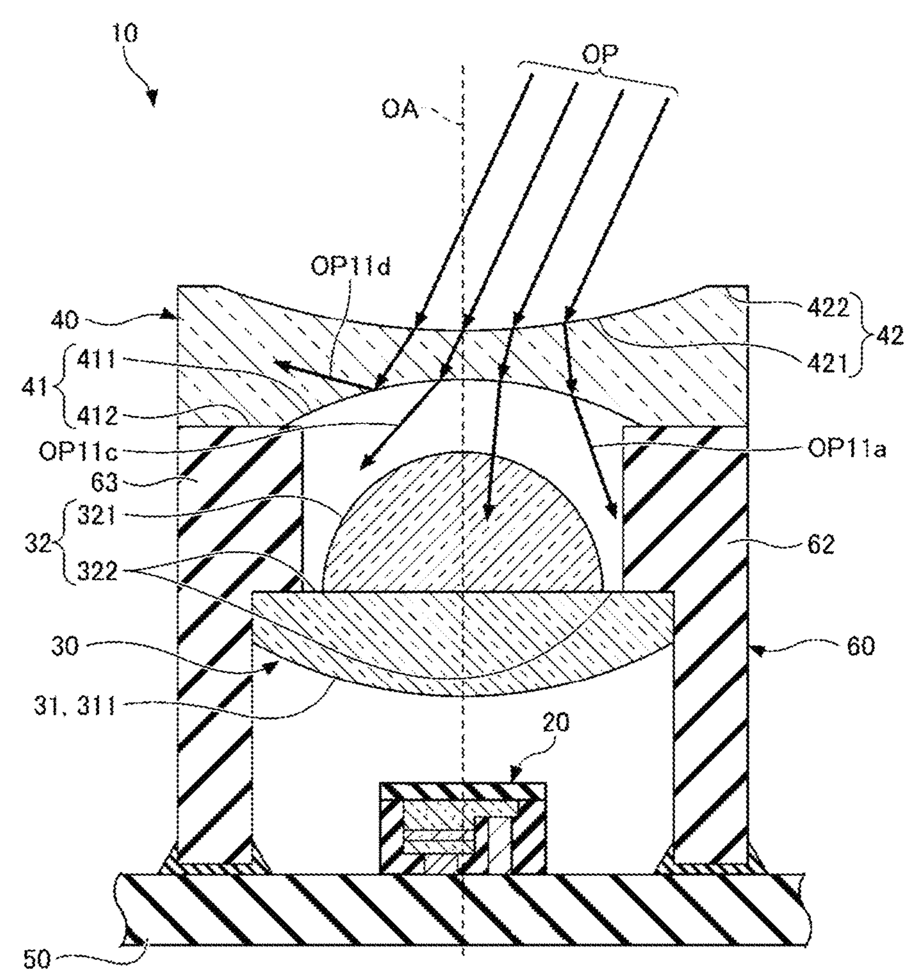
FIG. 3 is a schematic cross-sectional view explaining an example of the effect of the light emitting module according to the embodiment.
Figure 3:
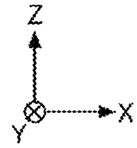
Figure 4:
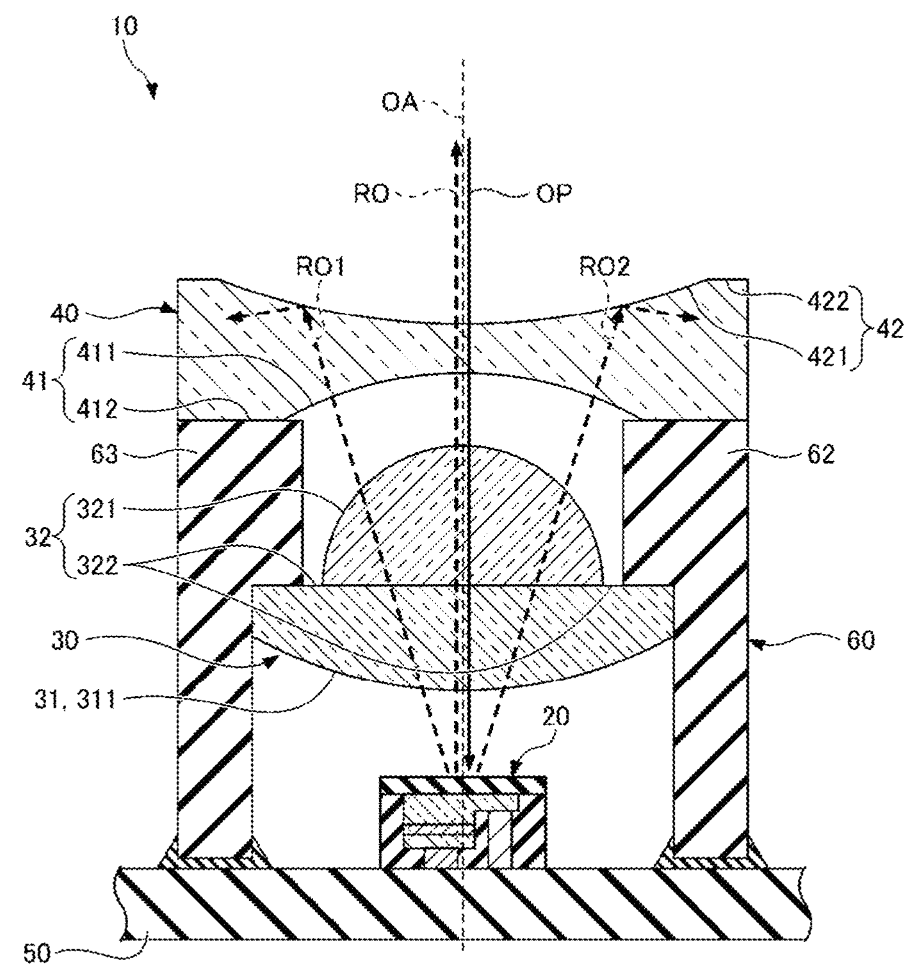
FIG. 4 is a schematic cross-sectional view explaining another example of the effect of the light emitting module according to the embodiment.
Figure 4:
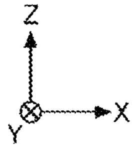
Figure 5:
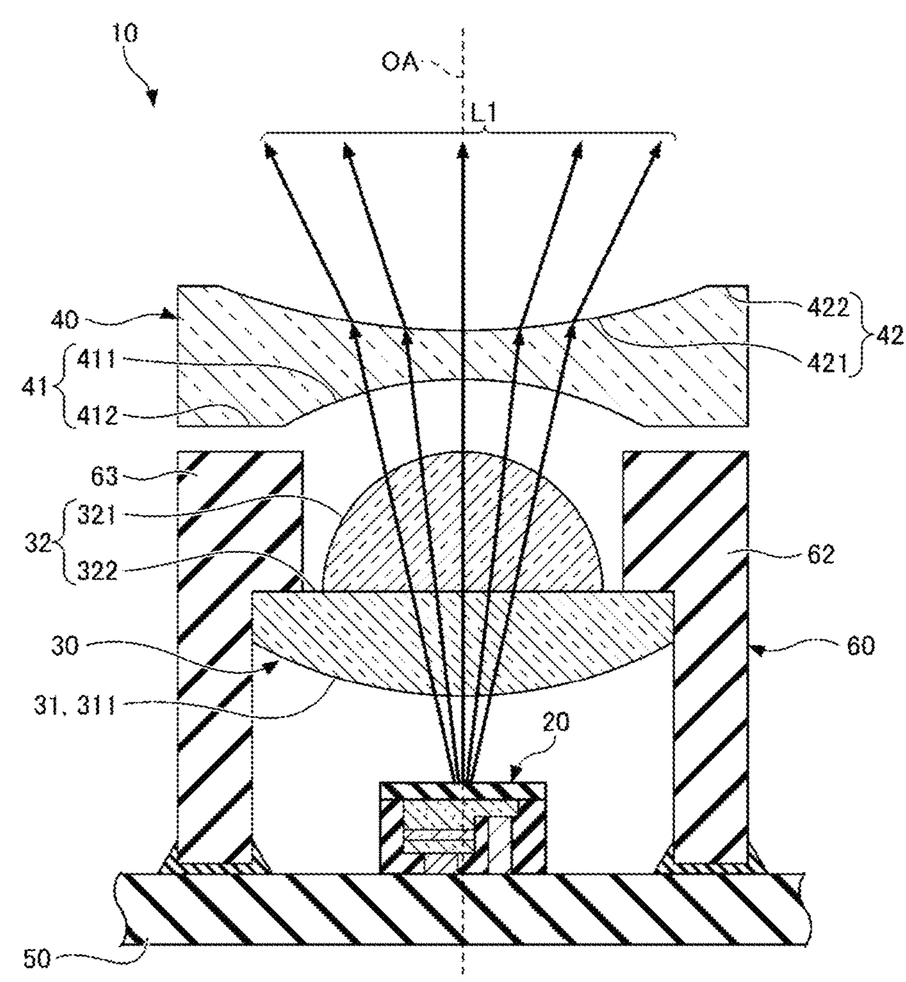
FIG. 5 is a schematic cross-sectional view explaining yet another example of the effect of the light emitting module according to the embodiment.
Figure 5:
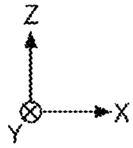

An example of a light emitting module 10 according to an embodiment will be described with reference to FIG. 2 to FIG. 5. FIG. 2 is a cross-sectional view schematically showing the light emitting module 10 taken along line II-II in FIG. 1. FIG. 3 is a schematic cross-sectional view explaining an example of the effect of the light emitting module 10. FIG. 4 is a schematic cross-sectional view explaining another example of the effect of the light emitting module 10. FIG. 5 is a schematic cross-sectional view explaining yet another example of the effect of the light emitting module 10.

As shown in FIG. 2, the light emitting module 10 includes a light source 20, a first lens 30, and a second lens 40. The light source 20, the first lens 30, and the second lens 40 are arranged apart from one another in the Z-axis direction. In the example shown in FIG. 2, the light emitting module 10 has one light source 20, but the number of light sources 20 included in the light emitting module 10 may be two or more. The light emitting module 10 may further include other constituents, such as a substrate 50, a lens support part 60, and the like.

The optical axis OA of the light emitting module 10 is parallel to the Z-axis direction and passes through the center of the light source 20 in a top view. The optical axis OA coincides with the optical axis of the first lens 30. In the present specification, the traveling angle of external light OP is expressed by using the optical axis OA as a reference. In other words, when the external light OP travels in parallel to the optical axis OA, the angle of the external light OP is "0°." When the external light OP travels oblique to the optical axis OA, the angle of the external light OP increases as the external light OP becomes more oblique to the optical axis OA. The angle of the light emitted by the light source 20 is similarly expressed by using the optical axis OA as a reference. FIG. 2 shows that the external light OP enters the light emitting module 10 from the +X side, but the direction in which the external light OP enters the light emitting module 10 may be from −X side or the like. This applies to the other drawings that show the external light OP.

Light Source 20

As shown in FIG. 2, the light source 20 includes a light emitting element 210, a wavelength conversion member 220, and a light shielding member 230. The wavelength conversion member 220 is disposed on the light emitting element 210. The light shielding member 230 is disposed to cover at least the lateral faces of the light emitting element 210. The light source 20 may include other constituents in addition to the light emitting element 210, the wavelength conversion member 220, and the light shielding member 230.

One example of the configuration of the light emitting element 210 will be described. As shown in FIG. 2, the light emitting element 210 includes a semiconductor structure 211, a first electrode 212, and a second electrode 213. The light emitting element 210 may further include other constituents such as a light transmissive element substrate disposed on the semiconductor structure. In the present specification, "light transmissive" refers to a transmittance of 60% or higher, preferably 80% or higher with respect to light. The transmittance does not have to be 60% or higher for all wavelengths.

The semiconductor structure 211 has a first semiconductor layer 211*a*, an emission layer 211*b*, and a second semiconductor layer 211*c*. As shown in FIG. 2, the first semiconductor layer 211*a*, the emission layer 211*b*, and the second semiconductor layer 211*c* are stacked in that order in the Z-axis direction. One of the first semiconductor layer 211*a* and the second semiconductor layer 211*c* is formed of a n-side semiconductor. The other of the first semiconductor layer 211*a* and the second semiconductor layer 211*c* is formed of a p-side semiconductor. The emission layer 211*b* may have a single quantum well (SQW) structure or a multiple quantum well (MQW) structure that includes multiple well layers.

The semiconductor structure 211 includes multiple semiconductor layers formed of nitride semiconductors. Nitride semiconductors include semiconductors of all compositions obtained by varying the composition ratio x and y in their ranges in the chemical formula $In_xAl_yGa_{1-x-y}N$ ($0 \leq x$, $0 \leq y$, $x+y \leq 1$). The peak wavelength of the light emitted by the emission layer 211*b* can be suitably selected in accordance with the purpose. The emission layer 211*b* is composed to be able to emit visible light or ultraviolet light, for example. In this embodiment, the peak wavelength of the light emitted by the emission layer 211*b* is preferably 400 nm to 530 nm, more preferably 420 nm to 490 nm, even more preferably 440 nm to 460 nm. The emission layer 211*b* emits blue light, for example. The peak wavelength of the light emitted by the emission layer 211*b* is not limited to these. Furthermore, the semiconductors constituting the first semiconductor layer 211*a*, the emission layer 211*b*, and the second semiconductor layer 211*c* are not limited to nitride semiconductors.

The semiconductor structure 211 may include multiple light emitting parts each including a first semiconductor layer 211*a*, an emission layer 211*b*, and a second semiconductor layer 211*c*. In the case in which the semiconductor structure 211 includes multiple light emitting parts, each of the light emitting parts may include well layers emitting light of the same or different emission peak wavelengths. The same peak emission wavelength can include a variation of about several nanometers. A combination of peak emission wavelengths of the light from such light emitting parts can be suitably selected. For example, in the case where the semiconductor structure 211 includes two light emitting parts, combinations of the light emitted by the light emitting parts include blue light and blue light, green light and green light, red light and red light, ultraviolet light and ultraviolet light, blue light and green light, blue light and red light, blue light and ultraviolet light, green light and red light, or the like. For example, in the case where the semiconductor structure 211 includes three light emitting parts, combinations of the light emitted by the light emitting parts include blue light, green light, and red light. Each light emitting part can include one or more well layers emitting light having different peak emission wavelengths from that of the light from other well layers.

The first electrode 212 and the second electrode 213 are positive and negative electrodes for allowing a current to flow through the semiconductor structure 211. As shown in FIG. 2, the first electrode 212 and the second electrode 213 are disposed apart from one another on the lower face side of the semiconductor structure 211. The first electrode 212 is connected to the first semiconductor layer 211*a* of the semiconductor structure 211. The second electrode 213 is connected to the second semiconductor layer 211*c* of the semiconductor structure 211.

Examples of materials for each of the first electrode 212 and the second electrode 213 include a metal, such as gold, silver, aluminum, nickel, rhodium, copper, titanium, platinum, palladium, molybdenum, chromium, tungsten, or the like, or an alloy of these metals. However, the materials for the first electrode 212 and the second electrode 213 are not limited to these. Each of the first electrode 212 and the second electrode 213 may have a single layer structure composed of a single metal material or alloy material, or a multilayer structure in which multiple metal materials or alloy materials are stacked in the Z-axis direction.

An example of the construction of a wavelength conversion member 220 will be described next. The wavelength conversion member 220 can convert the wavelength of at least a portion of the light emitted by the light emitting element 210 and emit light of a different wavelength. In other words, the wavelength conversion member 220 can output both the portion of the light emitted by the light emitting element 210 and the wavelength of which is converted by the wavelength conversion member 220, and the portion of the light that transmits through the wavelength conversion member 220 without undergoing wavelength conversion. The mixed color light of these is output from the upper face of the wavelength conversion member 220. The outgoing light from the upper face of the wavelength conversion member 220 will be referred to as "light L1 emitted by the light source 20" or "light L1" below. The upper face of the wavelength conversion member 220 corresponds to the upper face, the emission face, of the light source 20. The upper face of the wavelength conversion member 220 is occasionally referred to as the "upper face" of the light source 20. The wavelength conversion member 220 may be adapted to convert substantially all wavelengths of the light emitted by the emission layer 211*b*, and in this case the light output from the upper face of the wavelength conversion member 220 is essentially only the light whose wavelengths have been converted.

The wavelength conversion member 220 includes, for example, a light transmissive base and a phosphor. Examples of materials for the light transmissive base of the wavelength conversion member 220 include inorganic materials, including ceramics, such as aluminum nitride, aluminum oxide, yttrium oxide, or YAP (yttrium aluminum perovskite), glass, sapphire, and the like, and organic materials including resins that contain one or more of silicone resins, modified silicone resins, epoxy resins, modified epoxy resins, acrylic resins, phenol resins, and fluorocarbon resins, or hybrid resins. The phosphor included in the wavelength conversion member 220 may be contained in the light transmissive base or provided in the form of a layer disposed on the upper face or the lower face of a sheet shaped light transmissive base.

Examples of phosphors included in the wavelength conversion member 220 include yttrium aluminum garnet based phosphors (e.g., $(Y,Gd)_3(Al,Ga)_5O_{12}:Ce$), lutetium aluminum garnet based phosphors (e.g., $Lu_3(Al,Ga)_5O_{12}:Ce$), terbium aluminum garnet based phosphors (e.g., $Tb_3(Al,Ga)_5O_{12}:Ce$), CCA-based phosphors (e.g., $Ca_{10}(PO_4)_6Cl_2:Eu$), SAE based phosphors (e.g., $Sr_4Al_{14}O_{25}:Eu$), chlorosilicate based phosphors (e.g., $Ca_8MgSi_4O_{16}Cl_2:Eu$), silicate based phosphors (e.g., $(Ba,Sr,Ca,Mg)_2SiO_4:Eu$), oxynitride based phosphors, such as β-SiAlON phosphors (e.g., $(Si,Al)_3(O,N)_4:Eu$) or α-SiAlON phosphors (e.g., $Ca(Si,Al)_{12}(O,N)_{16}:Eu$), LSN-based phosphors (e.g., $(La,Y)_3Si_6N_{11}:Ce$), BSESN-based phosphors (e.g., $(Ba,Sr)_2Si_5N_8:Eu$), SLA based phosphors (e.g., $SrLiAl_3N_4:Eu$), nitride based phosphors, such as CASN-based phosphors (e.g., $CaAlSiN_3:Eu$) or SCASN-based phosphors (e.g., $(Sr,Ca)AlSiN_3:Eu$), fluoride based phosphors, such as KSF-based phosphors (e.g., $K_2SiF_6:Mn$), KSAF-based phosphors (e.g., $K_2(Si_{1-x}Al_x)F_{6-x}:Mn$ where x satisfies $0<x<1$), or MGF-based phosphors (e.g., $3.5MgO \cdot 0.5MgF_2 \cdot GeO_2:Mn$), quantum dots having a Perovskite structure (e.g., $(Cs,FA,MA)(Pb,Sn)(F,Cl,Br,I)_3$ where FA and MA represent formamidinium and methylammonium, respectively), group II-VI quantum dots (e.g., CdSe), group III-V quantum dots (e.g., InP), and quantum dots having a chalcopyrite structure (e.g., (AgCu)(In,Ga)(S, $Se)_2$).

The light source 20 may include a transparent layer on the wavelength conversion member 220 for protecting the wavelength conversion member 220 against moisture or the like. In the case in which the wavelength conversion member 220 contains a phosphor which is vulnerable to moisture, this can reduce moisture induced degradation of the phosphor. Moreover, it is preferable not to dispose a highly light scattering material as the uppermost surface of the light source 20, e.g., on the wavelength conversion member 220. Examples of highly light scattering members include a layer containing light reflecting particles, such as titanium oxide, barium titanate, aluminum oxide, or silicon oxide, and a layer whose upper face has micro-protrusions and micro-recesses formed by texturing or the like. Not disposing a highly light scattering member on the wavelength conversion member 220 can reduce scattering of the external light OP that reached the light source 20. This can reduce the scattered light from the light source 20 that originated from the external light OP to reach the outside of the light emitting module 10. In other words, this can reduce the external visibility of the light source 20. In the case in which the light source 20 includes a transparent layer on the wavelength conversion member 220, the transparent layer preferably contains no light diffuser or phosphor from the same standpoint.

One example of the construction of a light shielding member 230 will be described next. The light shielding member 230 preferably has a light shielding property. The "light shielding property" here refers to the property of not transmitting light. Examples of the properties of not transmitting light include a light blocking property, a light absorbing property, and a light reflecting property. The light shielding member 230 preferably has a light reflecting property. For example, the light shielding member 230 preferably has a reflectance of 60% or higher, more preferably 70% or higher, 80% or higher, or 90% or higher, with respect to the light emitted by the light source 20.

The light shielding member 230 includes light reflecting particles and an insulation base, for example. Examples of light reflecting particles include those composed of light reflecting substances, such as titanium oxide, zirconium oxide, boron nitride, and aluminum oxide. Light reflecting particles can include at least one of these substances. The insulation base may be composed of materials that include an organic material, an inorganic material, or both. For example, a resin such as a silicone resin can be used as an organic material. Alkali-metal silicate can be used as an inorganic material, for example.

The light shielding member 230 having a light reflecting property can reflect the light emitted from the lateral faces of the light emitting element 210 upwards. Allowing the light shielding member 230 to reflect the light from the lateral faces of the light emitting element 210 upwards can improve the light extraction efficiency of the light extracted from the emission face of the light source 20. The light shielding member 230 may have a two-layer structure composed of a highly light reflecting white member disposed on the inner side region that covers the light emitting element 210 and a highly light absorbing black or gray member disposed on the outer side region that constitutes the outer lateral faces of the light source 20. This can reduce the reflection and scattering of the external light OP that reached the light source 20.

Substrate 50

One example of the structure of a substrate 50 will be described next. The substrate 50 has, for example, an insulation base 51 and wiring. Examples of the materials for the base 51 include polyimide resin, polyester resin, glass epoxy, BT resin, aluminum nitride, and aluminum oxide. The substrate 50 can include, as wiring, upper face wiring disposed on the upper face of the base 51, lower face wiring disposed on the lower face of the base 51, and inner layer wiring disposed in the base 51 and connecting the upper face wiring and the lower face wiring. The upper face wiring is electrically connected to the first electrode 212 and the second electrode 213 of the light emitting element 210 of the light source 20. This electrically connects the light emitting element 210 of the light source 20 to an external power source via the lower face wiring and the inner layer wiring of the substrate 50. The light emitting module 10 may further include an electronic circuit such as a large scale integration (LSI) on the substrate 50 for controlling the emission operations of the light source 20.

The substrate 50 has an upper face, a lower face, and lateral face that connects the upper face and the lower face. The upper face of the substrate 50 is defined by the upper face of the base 51. The lower face of the substrate 50 is defined by the lower face of the base 51. The lateral face of the substrate 50 is defined by the lateral face of the base 51. In a top view, the substrate 50 has a substantially circular shape. However, the shape of the substrate 50 in a top view is not limited to substantially circular. The shape of the substrate 50 in a top view may be substantially quadrangular, substantially elliptical, substantially polygonal, or the like.

The light source 20 is mounted on the upper face of the substrate 50. At least the upper face of the substrate 50 preferably has a dark color appearance, more preferably a black appearance. In the present specification, a face or member having a "black color" appearance means that the face or member has the property of absorbing 90% or more of visible light including external light OP. Accordingly, the "black color" in the present specification includes, besides black color, colors similar to black such as dark gray. Allowing at least the upper face of the substrate 50 to have a black appearance can reduce the reflection of the external light OP that reached the upper face of the substrate 50. This can reduce the external visibility of the interior of the light emitting module 10. Furthermore, the surface roughness of the upper face of the substrate 50 may be increased to reduce the light reflection and increase the light absorption by the substrate 50.

Lens Support Part 60

One example of the construction of a lens support part 60 will be explained next. The lens support part 60 supports at least the first lens 30. As shown in FIG. 2, the lens support part 60 may further support the second lens 40.

The lens support part 60 is disposed outward of the light source 20 in a top view. The lens support part 60 preferably has a black appearance. The lens support part 60 having a black appearance can absorb the external light OP that has reached the lens support part 60 after having been reflected off the upper face of the light source 20, for example. This can reduce the external light OP reaching the outside of the light emitting module 10 after being reflected off the upper face of the light source 20 and reaching the lens support part 60. This, as a result, can make the light source 20 less visible from the outside.

In FIG. 2, as the lens support part 60, a lateral wall part 62 located on the +X side and a lateral wall part 63 located on the −X side are shown. As shown in FIG. 2, the two lateral wall parts 62 and 63 interpose the first lens 30 and the light source 20. The lens support part 60 supports the first lens 30 and the second lens 40. The lens support part 60 is bonded to the upper face of the substrate 50 via a bonding member 64 such as a known adhesive or the like.

The lens support part 60 may further have a lateral wall part disposed on the +Y side and a lateral wall part disposed on the −Y side. The lateral wall part disposed on the +Y side and the lateral wall part disposed on the −Y side may be connected to the lateral wall parts 62 and 63, respectively. This can dispose the lens support part 60 in a frame shape that surrounds the light source 20, the first lens 30, and the second lens 40 in a top view. The structure of the lens support part 60 is not limited to this, however. For example, the lens support part 60 disposed in the shape of a frame may be constructed with multiple lateral wall parts that are separated from one another, multiple linked lateral wall parts, or a single continuous lateral wall part.

The lens support part 60 has a projected portion 65 on the inner lateral face side that faces the first lens 30. The projected portion 65 projects towards the optical axis OA. In the example shown in FIG. 2, the projected portion 65 is a thick-walled portion of the lens support part 60, and is located to face the upper face 32 of the first lens 30 in the X-axis direction. The projected portion 65 is provided to surround the second convex face 321 included in the upper face 32 of the first lens 30. The first outer end part 322 of the first lens 30 described later is bonded to the lower face of the projected portion 65. The first lens 30 is supported by the lens support part 60 in this manner. The location and structure of the projected portion 65 are not limited to these.

First Lens 30

An example of the structure of a first lens 30 will be described. As shown in FIG. 2, the first lens 30 is disposed above the light source 20. More specifically, the first lens 30 is disposed between the light source 20 and the second lens 40 in the Z-axis direction while being supported by the lens support part 60. Examples of materials for the first lens 30 include light transmissive materials, such as polycarbonate resin, acrylic resin, silicone resin, and glass. The materials for the first lens 30 are not limited to these, and can be any other light transmissive material.

The first lens 30 includes a lower face 31 and an upper face 32. The lower face 31 of the first lens 30 includes a first convex face 311 projecting towards the light source 20. In the example shown in FIG. 2, the lower face 31 of the first lens 30 is composed only of the first convex face 311, but the structure of the lower face 31 is not limited to this. In other words, the lower face 31 of the first lens 30 may include a region in addition to the first convex face 311. The first convex face 311 shown in FIG. 2 is spherical, but can be aspheric.

As shown in FIG. 2, the lower face 31 of the first lens 30 is exposed from the lens support part 60. In other words, the space under the lower face 31 of the first lens 30 is not blocked by the lens support part 60. This allows for the first convex face 311 to occupy a larger area of the lower face 31. As a result, a larger amount of the light L1 emitted by the light source 20 is allowed to become incident on the convex face 311.

The surface of the convex face 311 is preferably not subjected to a roughening process such as texturing. This can reduce the scattering of the external light OP that reached the first lens 30 at the first convex face 311. This can reduce the recognition of the first convex face 311 from the outside as a high lightness region such as white. In other words, this can make the first lens 30 less visible.

The upper face 32 of the first lens 30 includes a second convex face 321 and a first outer end part 322. The second convex face 321 projects towards the second lens 40. In other words, the second convex face 321 is projecting in the opposite direction to the projection of the first convex face 311 in the Z-axis direction. The second convex face 321 shown in FIG. 2 is spherical, but can be aspheric.

The first outer end part 322 in a top view is located outward of the second convex face 321, and surrounds the second convex face 321. The first outer end part 322 extends from the outer edge of the second convex face 321 along the XY plane that is orthogonal to the Z-axis direction. The first outer end part 322 can be the part that is bonded to the projected portion 65 of the lens support part 60. In other words, as shown in FIG. 2, most of the first outer end part 322 is covered by the lens support part 60. This allows most of the external light OP reaching the first lens 30 to enter the first lens 30 through the second convex face 321. In a top view, the smaller the area of the first outer end part 322 in the upper face 32 of the first lens 30, the more preferable it is.

In a top view, the area of the second convex face 321 included in the upper face 32 is smaller than the area of the first convex face 311 included in the lower face 31. Here, the area of the second convex face 321 in a top view corresponds to the area of the second convex face 321 that is projected on an XY plane. The area of the first convex face 311 in a top view corresponds to the area of the first convex face 311 projected on an XY plane. In the description below, the area of a subject in a top view means the area of the subject that is projected on an XY plane.

Making the second convex face 321 on which the external light OP is incident relatively small in a top view can reduce the amount of external light OP that transmits through the second lens 40 to travel towards the light source 20. In other words, reducing the amount of external light OP that reaches the light source 20 can reduce the amount of external light OP that is reflected off the light source 20 and reaching the outside. This can make the light source 20 less visible from the outside. The light emitting module 10 is disposed on the display part 3 side of the mobile device 1 which is primarily seen by a user when operating the mobile device 1. An externally less visible light emitting module 10 including a light source 20 allows for the placement of the light emitting module 10 on the display part 3 side of a mobile device in a less conspicuous manner.

In this embodiment, the radius of curvature of the second convex face 321 included in the upper face 32 is smaller than the radius of curvature of the first convex face 311 included in the lower face 31. The smaller the radius of curvature of the second convex face 321, the more reduction results with respect to the external light OP that becomes incident on the second convex face 321. The larger the radius of curvature of the first convex face 311, the more efficient it is for the light from the light source 20 to enter the first lens 30.

The second convex face 321 is preferably not subjected to a surface roughening process such as texturing. This can reduce the scattering of the external light OP that reached the first lens 30 at the second convex face 321. This can reduce the recognition of the second convex face 321 from the outside as a high lightness region such as white. In other words, the first lens 30 is made less visible from the outside.

Second Lens 40

One example of the structure of a second lens 40 will be described next. As shown in FIG. 2, the second lens 40 is placed above the first lens 30. The second lens 40 faces a cover plate 3G. In the case in which the cover plate 3G of the display part 3 has an opening, the second lens 40 is exposed from the opening of the cover plate 3G. The material for constituting the second lens 40 may be a similar light transmissive material to that used for the first lens 30. The material for constituting the second lens 40 may be a different light transmissive material from that used for the first lens 30.

The second lens 40 includes a lower face 41 and an upper face 42. At least one of the lower face 41 and the upper face 42 of the second lens 40 includes a concave face. Each of the lower face 41 and the upper face 42 of the second lens 40 preferably includes a concave face. In the description below, the concave face included in the lower face 41 will be referred to as "concave face 411." The concave face 411 is depressed towards the +Z side. The concave face included in the upper face 42 will be referred to as "concave face 421." The concave face 421 is depressed towards the −Z side. As shown in FIG. 2, in a top view, the area of the concave face 421 included in the upper face 42 is larger than the area of the concave face 411 included in the lower face 41. The radius of curvature of the concave face 411 included in the lower face 41 is preferably smaller than the radius of curvature of the concave face 421 included in the upper face 42.

In the example shown in FIG. 2, each of the lower face 41 and the upper face 42 of the second lens 40 includes a concave face. The second lens 40 has only to include a concave face in at least one of the lower face 41 and the second face 42. In the case in which only the lower face 41 includes a concave face 411, the upper face 42 may be a flat face that is in parallel to an XY plane, for example. In the case in which only the upper face 42 includes a concave face 421, the lower face 41 may be a flat face that is in parallel to an XY plane, for example.

The lower face 41 of the second lens 40 may further include a second outer end part 412. The second outer end part 412 is located outward of and surrounding the concave face 411 in a top view. The second outer end part 412 extends from the outer edge of the concave face 411 along an XY plane. In the example shown in FIG. 2, the second outer end part 412 is bonded to the upper face of the lens support part 60. This can stably secure the second lens 40 above the first lens 30.

The upper face 42 of the second lens 40 may further include a third outer end part 422. The third outer end part 422 is located outward of and surrounding the concave face 421 in a top view. The third outer end part 422 extends from the outer edge of the concave face 421 along an XY plane. As shown in FIG. 2, the third outer end part 422 may be in contact with the peripheral region of the opening 3G1. In other words, in the example shown in FIG. 2, the second lens 40 may be in contact with the cover plate 3G. However, the second lens 40 may be apart from the cover plate 3G.

Examples of Effects of Light Emitting Module 10

Examples of the effects of the light emitting module 10 will be described with reference to FIG. 3 to FIG. 5. FIG. 3 and FIG. 4 are schematic cross-sectional views explaining examples when the light source 20 is unlit, and FIG. 5 is a schematic cross-sectional view explaining an example when the light source 20 is lit. One example of the effect of the light emitting module 10 will be described with reference to FIG. 3. Specifically, an example of the effect of reducing the visibility of the light source 20 achieved by the concave face 411 of the second lens 40 will be described. In FIG. 3 to FIG. 5, some of the directions of light rays are schematically shown to simplify the explanation. The directions in which the actual light travels might change due to refraction, scattering, or the like, which are not shown for simplification purposes.

As shown in FIG. 3, the external light OP which entered the light emitting module 10 enters the second lens 40 from the upper face 42 side. The external light OP exits the concave face 411 included in the lower face 41 of the second lens 40. At this time, the external light OP that has exited the concave face 411 is refracted at the concave face 411 to spread. Here, the normal direction at the concave face 411 differs depending on the location in the concave face 411, and thus the exit angle of the external light OP differs depending on the location in the concave face 411 at which a ray of external light OP reaches. A portion of the external light OP, such as external light OP11*a* or OP11*c*, travels towards the first outer end part 322 of the first lens 30 or the lens support part 60 after exiting the concave face 411. The first outer end part 322 of the first lens 30 and the lens support part 60 do not overlap the light source 20 in a top view. Thus, the external light OP11*a* or OP11*c* that headed towards the first outer end part 322 of the first lens 30 or the lens support part 60 does not reach the light source 20. The external light OP11*a* or OP11*c* that headed towards the first outer end part 322 of the first lens 30 or the lens support part 60 is absorbed by the black colored lens support part 60, for example.

Another portion of the external light OP such as OP11*d* is totally reflected at the concave face 411 and heads towards the lateral face or the upper face 42 of the second lens 40. In other words, the external light OP that is totally reflected at the concave face 411 such as external light OP11*d* does not reach the light source 20 either. As described above, including a concave face 411 in the lower face 41 of the second lens 40 can reduce the amount of external light OP that reaches the light source 20. As a result, the light source 20 is made less visible from the outside.

Furthermore, making the radius of curvature of the concave face 411 included in the lower face 41 smaller than the radius of curvature of the concave face 421 included in the upper face 42 can increase the region for total internal reflection of the external light OP. This can further reduce the amount of external light OP that reaches the light source 20, thereby making the light source 20 less visible from the outside.

Moreover, making the area of the concave face 421 included in the upper face 42 larger than the area of the concave face 411 included in the lower face 41 in a top view can reduce the amount of external light OP that exits the concave face 411. This can further reduce the amount of external light OP reaching the light source 20, thereby making the light source 20 less visible from the outside.

The concave face 411 and the concave face 421 are preferably not subjected to a roughening process such as texturing. Not subjecting the concave face 411 and the concave face 421 to a roughening process can reduce the scattering of the external light OP at the concave face 411 and the concave face 421. This can reduce the external visibility of the concave face 411 and the concave face 421 as high lightness regions such as white regions. In other words, this can make the second lens 40 less visible from the outside.

Another example of the effect of the light emitting module 10 will be explained next with reference to FIG. 4. Specifically, an example of the effect of reducing the external visibility of the light source 20 achieved by the concave face 421 included in the upper face 42 of the second lens 40 will be explained.

As shown in FIG. 4, in the case in which the external light OP that passed through the first lens 30 reached the upper face of the light source 20, the external light OP is reflected or scattered at the upper face of the light source 20. The external light OP that is reflected off the light source 20 will be referred to as "reflected light RO" below.

The reflected light RO reflected off the upper face of the light source 20 heads towards the first lens 30. The reflected light RO enters the second lens 40 from the lower face 41 after passing through the first lens 30. Then the reflected light RO reaches the concave face 421 included in the upper face 42 of the second lens 40.

At this time, the reflected light RO that reached a position away from the optical axis OA of the concave face 421, such as reflected light RO1 or RO2, is totally reflected at the concave face 421 and travels towards the lateral face or the lower face 41 of the second lens 40. In other words, a portion of the reflected light RO does not exit the concave face 421, not reaching the outside of the light emitting module 10. As such, including a concave face 421 in the upper face 42 of the second lens 40 can reduce the amount of the reflected light RO that reaches the outside of the light emitting module 10. As a result, the external visibility of the light source 20 can be reduced.

In FIG. 4, rays of reflected light RO, including reflected light RO1 and RO2, are shown as if to travel straight through the first convex face 311 included in the lower face 31 of the first lens 30, the second convex face 321 included in the upper face 32 of the first lens 30, and the concave face 411 included in the lower face 41 of the second lens 40. However, the paths of rays of reflected light RO shown in FIG. 4 are provided for the sake of explanation and convenience, and, in reality, the reflected light RO is refracted at the first convex face 311, the second convex face 321, and the concave face 411.

Another example of the effect of the light emitting module 10 will be explained next with reference to FIG. 5. Specifically, another effect of the concave face 421 of the second lens 40 will be explained. As shown in FIG. 5, the light L1 emitted from the light source 20 passes through the first lens 30 and enters the second lens 40 from the lower face 41. The light L1 reaches the concave face 421 included in the upper face 42 of the second lens 40 before exiting the concave face 421. At this time, the more distant the exit point in the concave face 421 is from the optical axis OA, the larger the output angle of the light L1 results. Accordingly, the irradiation range of the light L1 emitted from the light emitting module 10 is greater than that resulting from a flat upper face 42 without a concave face 421.

In FIG. 5, rays of light L1 are shown as if to travel straight through the first convex face 311 included in the lower face 31 of the first lens 30, the second convex face 321 included in the upper face 32 of the first lens 30, and the concave face 411 included in the lower face 41 of the second lens 40. However, the paths of rays of light L1 are provided for the sake of explanation and convenience, and, in reality, light L1 is refracted at the first convex face 311, the second convex face 321, and the concave face 411.

When a photo of a subject facing the display part 3 of a mobile device 1 (e.g., a user of the mobile device 1) is taken by using the camera 5 shown in FIG. 1, the distance between the camera 5 and the subject is expected to be small. Thus, the camera 5 can be operated by using a wide-angle mode, for example. In other words, the angle of view of the camera 5 can be set wide. As described with reference to FIG. 5, including a concave face 421 in the upper face 42 of the second lens 40 allows the light emitting module 10 to broaden the irradiation range of the light L1. Accordingly, even in the case where the camera 5 is set to a wide angle, irradiation nonuniformity can be reduced for the light irradiated in the range that corresponds to the angle of view of the camera 5. In other words, the light emitting module 10 is suited for use as a flash module of the camera 5 that is installed on the display part 3 side.

EXAMPLES

The light emitting module 10 will be described in more detail using Example 1 and Comparative Example 1 next. The light emitting module 10, however, is not limited to the examples described below.

Example 1 corresponds to a light emitting module 10 that includes similar constituents to those described with reference to FIG. 2 to FIG. 5. In other words, in Example 1, the lower face 41 and the upper face 42 of the second lens 40 include concave faces 411 and 421, respectively. The light emitting module in Comparative Example 1 differs from Example 1 such that both the lower face 41 and the upper face 42 of the second lens 40 had flat faces. The module in Comparative Example 1 is otherwise similar to that in Example 1.

For Example 1 and Comparative Example 1 constructed as above, the proportions of the external light OP that reached the upper face 32 of the first lens 30 or the upper face of the light source 20 after entering the modules under the conditions described below were calculated using simulation. Specifically, the proportions of the external light OP becoming incident on the upper face 32 of the first lens 30 and the upper face of the light source 20 were calculated using simulation by assuming that the external light OP before entering Example 1 or Comparative Example 1 is a group of light rays traveling in parallel with one another, and using angles of incidence of the external light OP of 0°, 30°, and 45°.

Table 1 shows the simulation results of the proportions of the rays of external light OP reaching the upper face 32 of the first lens 30. Table 2 shows the simulation results of the proportions of the rays of external light OP reaching the upper face of the light source 20. Here, a proportion of external light OP refers to a percentage of the number of rays reaching the upper face 32 of the first lens 30 or the upper face of the light source 20 relative to the total number of rays of external light OP entering Example 1 or Comparative Example 1. In other words, the smaller the percentage of rays of external light OP reaching the upper face 32 of the first lens 30 or the upper face of the light source 20, the less it is for the external light OP to reach the light source 20, i.e., the less externally visible the light source 20 becomes.

TABLE 1

| External Light OP Angle | Example 1 | Comparative Example 1 |
|---|---|---|
| 0° | 47% | 60% |
| 30° | 33% | 53% |
| 45° | 27% | 47% |

TABLE 2

| External Light OP Angle | Example 1 | Comparative Example 1 |
|---|---|---|
| 0° | 47% | 47% |
| 30° | 27% | 40% |
| 45° | 27% | 33% |

As shown in Table 1 and Table 2, the percentages of the rays of external light OP reaching the upper face 32 of the first lens 30 and the upper face of the light source 20 in Example 1 were equal to or lower than those in Comparative Example 1.

Variation 1

Figure 6:
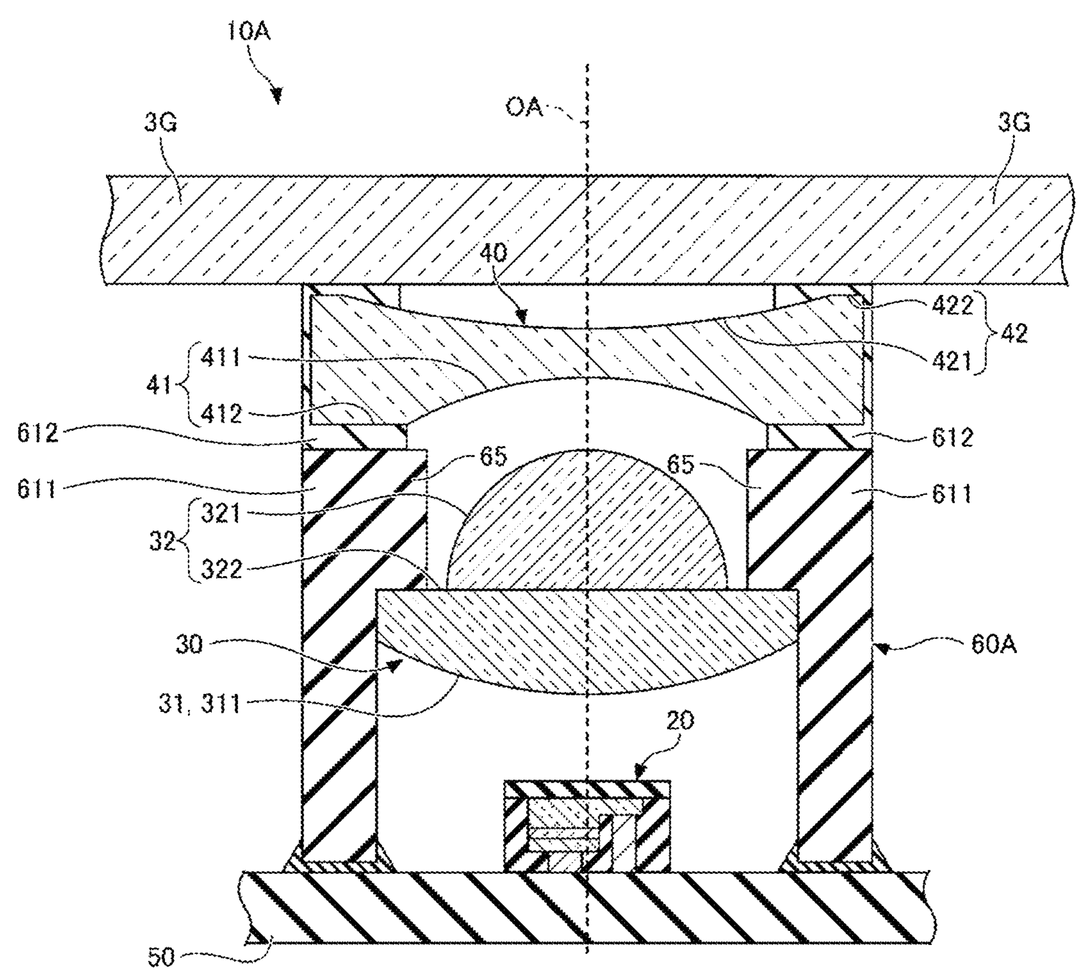
FIG. 6 is a schematic cross-sectional view of a light emitting module according to Variation 1 of the embodiment.
Figure 6:
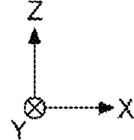

A light emitting module 10A according to Variation 1 of the embodiment will be described next with reference to FIG. 6. FIG. 6 is a schematic cross-sectional view of the light emitting module 10A of Variation 1 taken along a XZ plane. In Variation 1, the same reference numerals denote similar constituents to those in the embodiment described above for which explanation is omitted as appropriate.

In the light emitting module 10A according to Variation 1, the structure of the lens support part 60A differs from the lens support part 60 of the embodiment. Specifically, as shown in FIG. 6, the lens support part 60A in the light emitting module 10A includes a first lens support part 611 bonded to the substrate 50 and a second lens support part 612 disposed on the first lens support part 611.

The first lens support part 611 has a structure same as or similar to the lens support part 60 of the embodiment. In other words, the first lens support part 611 includes a projected portion 65 that is bonded to the first outer end part 322 included in the upper face 32 of the first lens 30. In this manner, the first lens support part 611 supports the first lens 30.

The second lens support part 612 supports the second lens 40. Specifically, the second lens support part 612 covers the lateral face of the second lens 40, the second outer end part 412 included in the lower face 41 of the second lens 40, and the third outer end part 422 included in the upper face 42 of the second lens 40. The second lens support part 612 preferably has a black appearance.

The second lens support part 612 having a black appearance allows the second lens support part 612 to absorb the external light OP totally reflected at the concave face 411 included in the lower face 41 of the second lens 40, thereby reducing the light that reaches the outside of the light emitting module 10A. A portion of the reflected light RO reflected off the upper face of the light source 20 and transmitted through the first lens 30 is absorbed by the second lens support part 612. This can reduce the amount of the reflected light RO reflected off the upper face of the light source 20 that reaches the outside of the light emitting module 10A. As a result, the external visibility of the interior of the light emitting module 10A can be reduced. The surface roughness of the surfaces of the second lens 40 that are in contact with the second lens support part 612 (e.g., the third outer end part 422 and lateral face) may be increased. This can reduce the total internal reflection at the interfaces between the second lens support part 612 and the second lens 40.

Variation 2

Figure 7:
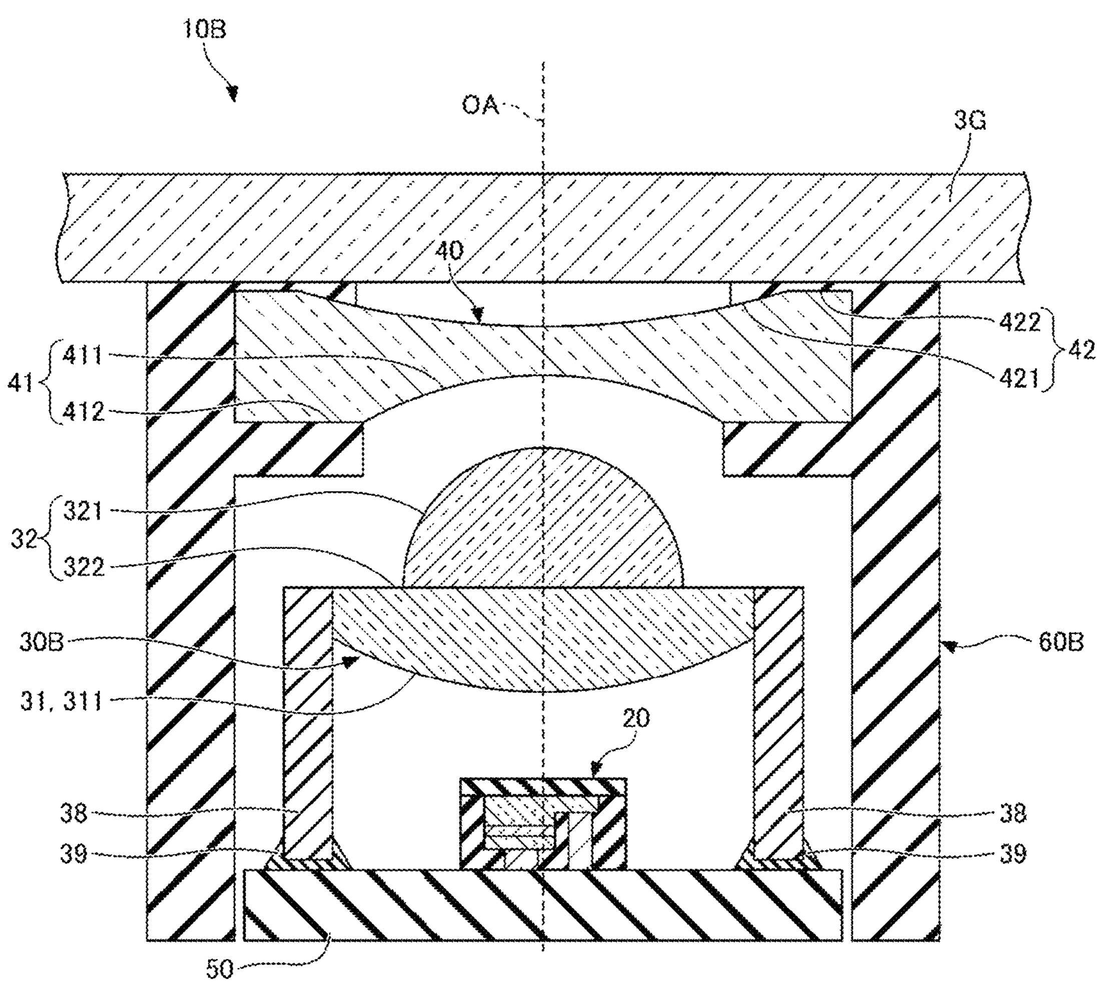
FIG. 7 is a schematic cross-sectional view of a light emitting module according to Variation 2 of the embodiment.
Figure 7:
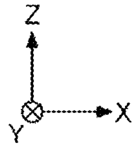

A light emitting module 10B according to Variation 2 of the embodiment will be described next with reference to FIG. 7. FIG. 7 is a schematic cross-sectional view of the light emitting module 10B of Variation 2 taken along a XZ plane. In Variation 2, the same reference numerals denote similar constituents to those in the embodiment or Variation 1 for which explanation is omitted as appropriate.

In the light emitting module 10B according to Variation 2, the structure of the first lens 30B differs from the first lens 30 of the embodiment and Variation 1. Moreover, the structure of the lens support part 60B of the light emitting module 10B according to Variation 2 differs from the lens support part 60 of the embodiment and the lens support part 60A of Variation 1.

As shown in FIG. 7, the first lens 30B further includes a leg part 38 bonded to the substrate 50. The leg part 38 may be bonded to the upper face of the substrate 50 via a bonding member 39 such as a known adhesive. The leg part 38 extends from the lateral face of the first lens 30B between the lower face 31 and the upper face 32 towards the substrate 50.

The leg part 38 may be formed of a light transmissive material, such as a polycarbonate resin, acrylic resin, silicone resin, or glass. The leg part 38 may be formed of a non-light transmissive resin material. In this case, the resin material composing the leg part 38 preferably has a black appearance. The leg part 38 having a black appearance can absorb the portion of the reflected light RO reflected off the upper face of the light source 20 that reached the leg part 38. This can reduce the amount of the reflected light RO reflected off the upper face of the light source 20 that reaches the outside of the light emitting module 10B. As a result, the external visibility of the light source 20 can be reduced.

The first lens 30B is separated from the lens support part 60B. In other words, the first lens 30B is not supported by the lens support part 60B. The lens support part 60B supports only the second lens 40.

Preferable embodiments of the present disclosure have been described in the foregoing. However, without being limited by the embodiments described above, various modifications and substitutions can be made without deviating from the scope of the claims.

What is claimed is:

1. A light emitting module comprising:
- a light source;
- a first lens disposed above the light source; and
- a second lens disposed above the first lens; wherein:
- the first lens comprises:
  - a lower face comprising a first convex face projecting towards the light source, and
  - an upper face comprising a second convex face projecting towards the second lens;
- in a top view, an area of the second convex face is smaller than an area of the first convex face;
- a lower face of the second lens comprises a first concave face; and
- in a top view, an area of the first concave face is larger than the area of the second convex face.

2. The light emitting module according to claim 1, wherein the upper face of the second lens comprises a second concave face.

3. The light emitting module according to claim 2, wherein a radius of curvature of the first concave face is smaller than a radius of curvature of the second concave face.

4. The light emitting module according to claim 2, wherein, in a top view, an area of the second concave face is larger than an area of the first concave face.

5. The light emitting module according to claim 1, further comprising a lens support part disposed outward of the light source in a top view and supporting at least the first lens.

6. The light emitting module according to claim 5, wherein:

the lens support part comprises a projected portion on the inner lateral face;

the upper face of the first lens further comprises an outer end part surrounding the second convex face in a top view; and the first lens is configured to be supported by the lens support part as the outer end part is bonded to a lower face of the projected portion of the lens support part.

7. The light emitting module according to claim 6, wherein the lower face of the first lens is exposed from the lens support part.

8. The light emitting module according to claim 5, wherein:

the lower face of the second lens comprises an outer end part positioned outward of the first concave face in a top view; and the outer end part is bonded to an upper face of the lens support part.

9. The light emitting module according to claim 1, further comprising a substrate comprising an upper face on which the light source is mounted.

10. A smart phone or tablet comprising:

a casing, which is a smart phone casing or a tablet casing;

a display part comprising a display screen; and a light emitting module disposed on a display part side in a top view, the light emitting module comprising:

a light source, a first lens disposed above the light source, and a second lens disposed above the first lens, wherein:

the first lens comprises:

a lower face comprising a first convex face projecting towards the light source, and an upper face comprising a second convex face projecting towards the second lens, an area of the second convex face is smaller than an area of the first convex face in a top view, and in a top view, at least one of an upper face or a lower face of the second lens comprises a concave face.

11. The mobile device according to claim 10, wherein the upper face of the second lens and the lower face of the second lens each comprise a concave face.

12. The mobile device according to claim 11, wherein a radius of curvature of the concave face comprised in the lower face of the second lens is smaller than a radius of curvature of the concave face comprised in the upper face of the second lens.

13. The mobile device according to claim 11, wherein, in a top view, an area of the concave face comprised in the upper face of the second lens is larger than an area of the concave face comprised in the lower face of the second lens.

14. The mobile device according to claim 10, wherein the light emitting module further comprises a lens support part disposed outward of the light source in a top view and supporting at least the first lens.

15. The mobile device according to claim 14, wherein:

the lens support part comprises a projected portion on the inner lateral face;

the upper face of the first lens further comprises an outer end part surrounding the second convex face in a top view; and the first lens is configured to be supported by the lens support part as the outer end part is bonded to a lower face of the projected portion of the lens support part.

16. The mobile device according to claim 15, wherein the lower face of the first lens is exposed from the lens support part.

17. The mobile device according to claim 14, wherein:

the lower face of the second lens comprises the concave face and an outer end part positioned outward of the concave face in a top view; and the outer end part is bonded to an upper face of the lens support part.

18. The mobile device according to claim 10, wherein the light emitting module further comprises a substrate comprising an upper face on which the light source is mounted.

19. A light emitting module comprising:

a light source;

a first lens disposed above the light source; and a second lens disposed above the first lens; wherein:

the first lens comprises:

a lower face comprising a first convex face projecting towards the light source, and an upper face comprising a second convex face projecting towards the second lens;

in a top view, an area of the second convex face is smaller than an area of the first convex face; and a lower face of the second lens comprises a first concave face;

an upper face of the second lens comprises a second concave face; and a radius of curvature of the first concave face is smaller than a radius of curvature of the second concave face.

* * * * *